(12) United States Patent
Terhune

(10) Patent No.: US 7,455,938 B2
(45) Date of Patent: Nov. 25, 2008

(54) METHODS OF FORMING PATTERNS IN SUBSTRATES

(75) Inventor: Robert V. Terhune, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 700 days.

(21) Appl. No.: 11/097,734

(22) Filed: Apr. 1, 2005

(65) Prior Publication Data

US 2006/0222963 A1 Oct. 5, 2006

(51) Int. Cl.
*G03F 1/00* (2006.01)
*G03C 5/00* (2006.01)

(52) U.S. Cl. .......................................... 430/5; 430/311
(58) Field of Classification Search ..................... 430/5, 430/394; 716/19–21
See application file for complete search history.

(56) References Cited

U.S. PATENT DOCUMENTS

| | | | |
|---|---|---|---|
| 5,795,688 A | 8/1998 | Burdorf et al. | |
| 6,280,887 B1 * | 8/2001 | Lu | 430/5 |
| 6,303,253 B1 * | 10/2001 | Lu | 430/5 |
| 6,373,975 B1 | 4/2002 | Bula et al. | |
| 6,376,131 B1 | 4/2002 | Cho et al. | |
| 6,777,276 B2 | 8/2004 | Crowder et al. | |
| 6,803,155 B2 | 10/2004 | Dulman et al. | |
| 6,854,106 B2 | 2/2005 | Baggenstoss et al. | |
| 7,341,808 B2 * | 3/2008 | Houston et al. | 430/5 |
| 2004/0214096 A1 | 10/2004 | Dulman et al. | |

OTHER PUBLICATIONS

"Optical Proximity Correction", website: http://www.synopsys.com/products/ncimrg/opc_ds.html, reprinted Dec. 21, 2004, 2 pages.
Schellenberg, F., "Sub-Wavelength Lithography Using OPC", website: http://www.semiconductorfabtech.com/features/lithography/articles/9.205.php3, reprinted Dec. 21, 2004, 11 pages.
Farkas, R. et al., "Optimization of One- and Two Dimensional Masks in the Optical Lithography", website: http://km.aifb.uni-karlsruhe.de/ws/LLWA/fgml/final/kokai.pdf, reprinted Dec. 21, 2004, 8 pages.
Abstract: Hong, L., "Akylsilane Self-Assembled Monolayer Photolithography: Effects of Proximity Gap on Photodegradation and Patterning Resolution", Jpn. J. Appl. Phys. Part 2, vol. 42, No. 4A (2003), pp. L394-397.
Abstract: Schurz, D. et al., "Simulation Study of Reticle Enhancement Technology Applications for 157-nm Lithography", Proceedings of the SPIE—The International Soc. for Optical Engineering Conference, Oct. 3-5, 2001, vol. 4562, pp. 902-913.

* cited by examiner

*Primary Examiner*—Stephen Rosasco
(74) *Attorney, Agent, or Firm*—Wells St. John P.S.

(57) ABSTRACT

The invention includes methods of forming a pattern in a substrate. A feature location is defined where a square corner is desired to be patterned into the substrate. A mask is generated which is to be utilized in creating a substantially square corner at the feature location. The mask has a linear sub-resolution component extending across the feature location. Radiation is provided through the mask to pattern the substantially square corner at the feature location.

13 Claims, 9 Drawing Sheets

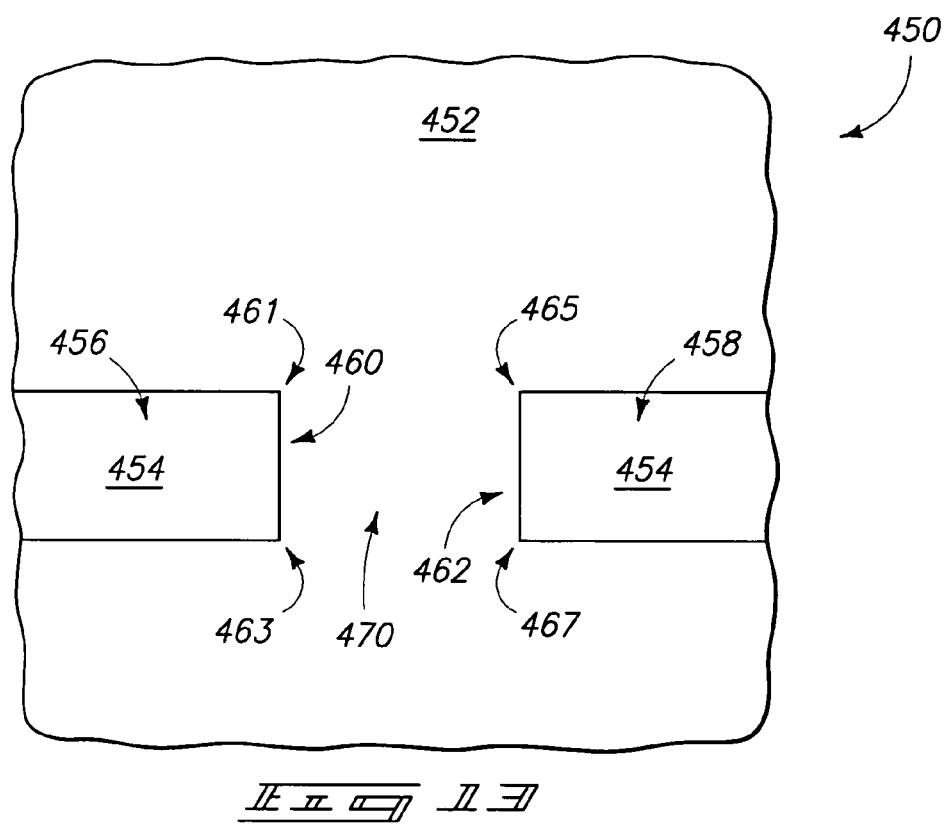
_FIG. 13_
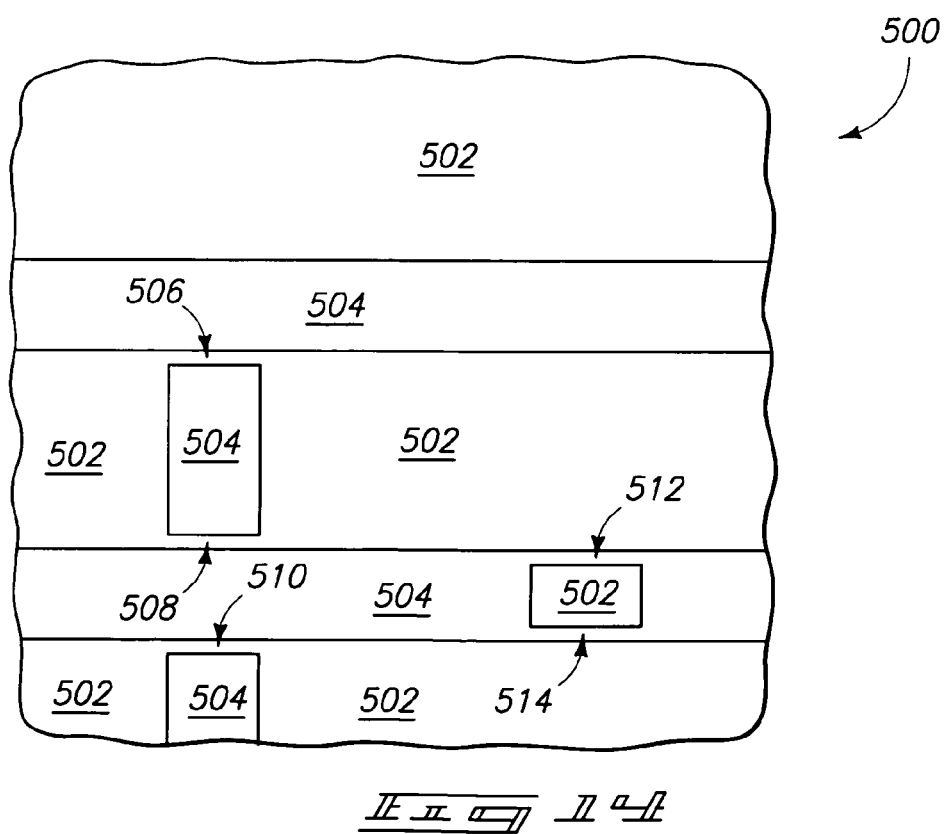
_FIG. 14_

METHODS OF FORMING PATTERNS IN SUBSTRATES

TECHNICAL FIELD

The invention pertains to methods of forming patterns in substrates. In particular aspects, the invention pertains to methods of forming patterns in radiation-imageable material associated with radiation-patterning tool substrates. In other particular aspects, the invention pertains to methods of forming patterns in radiation-imageable material associated with semiconductor substrates.

BACKGROUND OF THE INVENTION

Photolithography is commonly used during formation of integrated circuits on semiconductor wafers. More specifically, a form of radiant energy (such as, for example, ultraviolet light) is passed through a radiation-patterning tool and onto a radiation-sensitive material (such as, for example, photoresist) associated with a semiconductor wafer. The radiation-patterning tool can be referred to as a photomask or a reticle. The term "photomask" traditionally is understood to refer to masks which define a pattern for an entirety of a wafer, and the term "reticle" is traditionally understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the terms "reticle" and "photomask" are utilized interchangeably.

Advances in semiconductor integrated circuit performance have typically been accompanied by a simultaneous decrease in integrated circuit device dimensions and a decrease in the dimensions of conductor elements which connect those integrated circuit devices. The demand for ever smaller integrated circuit devices brings with it demands for ever-decreasing dimensions of structural elements, and ever-increasing requirements for precision and accuracy in radiation patterning.

Exemplary prior art processes for patterning radiation are described with reference to FIGS. 1-9.

Referring initially to FIG. 1, an exemplary reticle 10 is illustrated in a process for forming a radiation-intensity pattern in a radiation-imageable material 44 associated with an exemplary semiconductor construction 40.

The reticle includes a so-called main-field region 12, and a peripheral region 14 surrounding the main-field region. Dashed lines 15 are provided to diagrammatically illustrate boundaries between the peripheral region 14 and the main-field region 12.

Reticle 10 is shown comprising a base 16, a first layer 18 directly against the base, and a second layer 20 directly against the first layer. The base 16 can be a relatively transparent material, such as, for example, quartz; the first layer 18 can be a material of intermediate transparency, such as, for example, molybdenum silicide; and the second layer 20 can be a relatively opaque material, such as, for example, a material comprising, consisting essentially of, or consisting of chromium.

The terms "relatively transparent" and "relatively opaque" are utilized to indicate that the materials 16 and 20 are transparent and opaque, respectively, relative to one another. Material 16 will typically be substantially entirely transparent, and accordingly will typically have a transmittance of about 100%. Material 20 will typically be substantially entirely opaque, and accordingly will typically have a transmittance of about 0%. Material 18 will have a transparency intermediate the transparency of base 16 and layer 20, and can have a transmittance of, for example, about 6%. Accordingly, material 18 attenuates radiation, but is not entirely opaque to the radiation.

The main-field region 12 is shown having a plurality of patterned features 22, 24, 26 and 28 provided therein, and having a series of gaps 21, 23, 25, 27 and 29 between the features. Some of the features contain the relatively opaque material 20 (features 24 and 26) while others only contain the intermediate transparency material 18 (features 22 and 28). Features 24 and 26 will substantially block radiation, while features 22 and 28 will reduce an intensity of the radiation passing therethrough without entirely blocking the radiation. Features 22 and 28 can be used for changing more than just an intensity of the radiation. For example, features 22 and 28 can be used to impose a phase-shift on the radiation.

Exemplary radiation 30 is shown directed toward reticle 10 from above the reticle, and is shown passing through the main-field of the reticle. The radiation is patterned by the main-field of the reticle. Specifically, the radiation passing from the main-field of the reticle has a primary pattern of intensity imposed by the reticle.

The semiconductor construction 40 is shown beneath the reticle. The construction 40 comprises a substrate 42 having the radiation-imageable material 44 thereover.

Substrate 42 can comprise a monocrystalline silicon wafer at a processing stage of integrated circuit fabrication, and accordingly having various materials associated therewith. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Radiation-imageable material 44 can comprise, consist essentially of, or consist of photoresist.

Radiation patterned by the main-field 12 of the reticle forms a primary intensity pattern 46 within radiation-imageable material 44. The general location of the primary pattern is bounded by dashed lines 47, and features of the primary pattern are illustrated by dashed lines 49, 50 and 51.

The intensity of radiation within primary pattern 46 is diagrammatically illustrated by the depth of the radiation within material 44, with deeper regions indicating higher intensity and less deep regions indicating less intensity. The primary pattern has high-intensity regions 60, 62, 64, 66 and 68 corresponding to areas where radiation is passed through gaps 21, 23, 25, 27 and 29, respectively, of the main-field region 12 of the reticle. The primary pattern also has zero-intensity regions 70 and 72 where the radiation has been blocked by features 24 and 26, respectively, of the main-field region. Additionally, the primary pattern has intermediate intensity regions 74 and 76 where the radiation has been partially-blocked by the features 22 and 28, respectively, of the main-field region.

After the intensity pattern is formed within the radiation-imageable material 44, the material 44 can be subjected to development with an appropriate solvent to selectively remove either exposed or non-exposed regions of the material. The development will thus transfer a pattern into the material corresponding to either the shown pattern of intensity or an inverse of the shown pattern of intensity.

The process of FIG. 1 shows the reticle 10 utilized as a mask for patterning radiation. The reticle 10 is actually itself formed with patterned radiation, and accordingly can be considered to be formed with a prior masking step. The mask utilized for forming the reticle may be a physical mask similar to the reticle, or may be another structure which can pattern radiation intensity. For instance, reticles are frequently formed by electron-beam or laser beam imaging of radiation-sensitive materials associated with a reticle substrate. Electron beam or laser beam radiation is typically not patterned by passing the beam through a reticle, but rather is patterned by passing the beam through masking elements associated with a laser beam or electron-beam apparatus. The masking elements will form polygonal shapes from the beam, such as, for example, triangular shapes or rectangular shapes.

A general prior art process for creating and subsequently utilizing a reticle is described with reference to a flow chart in FIG. 2. A first step 100 of the FIG. 2 process comprises generating a first mask for reticle formation. This comprises identifying elements which are ultimately to be formed with the reticle, conducting optical proximity corrections and possibly other corrections which account for differences between the pattern formed in a reticle and the pattern obtained from the reticle (such corrections can, for example, account for interference effects which occur in light as openings in the reticle approach the wavelength of light), and calculation of a masking pattern to be utilized for forming the features in the reticle which can ultimately be utilized to pattern radiation during formation of desired features in a radiation-imageable material. As discussed above, the first mask may be a large mask like a reticle, but typically would be a radiation-modifying structure traveling with a laser beam or an electron beam during the writing of a desired pattern onto the reticle.

Step 102 of the FIG. 2 process has radiation provided through the first mask and onto a reticle substrate to form a desired pattern in the reticle substrate. Actually, the radiation would be utilized to form a pattern in a radiation-imageable material associated with the reticle substrate, and the pattern would then be transferred into the reticle substrate with a suitable etch. The formation of the pattern in a radiation-imageable material and subsequent transfer of the pattern to the reticle substrate can be a multi-step process comprising formation of a radiation-intensity pattern within the radiation-imageable material, development of the radiation-imageable material to convert the intensity pattern into a physical pattern within the radiation-imageable material, and utilization of the patterned radiation-imageable material during the etch of the underlying reticle substrate. After the etch to pattern the reticle substrate, the reticle substrate can be utilized as a mask for patterning a radiation-imageable material associated with a semiconductor substrate. Accordingly, the reticle substrate is considered to be a second mask, and the formation of the desired pattern in the reticle substrate is considered part of a process for generating the second mask from the reticle substrate.

In step 104 of the FIG. 2 process, radiation is provided through the second mask (i.e., the patterned mask formed from the reticle substrate) and onto a radiation-imageable material to form a desired pattern within the radiation-imageable material. The formation of the desired pattern within the radiation-imageable material can be considered to be part of a multi-step process. Specifically, the radiation patterned by the second mask can form an intensity pattern within the radiation-imageable material, and subsequently the material can be developed. Such development can selectively remove portions of the radiation-imageable material exposed to a threshold intensity of the radiation relative to other portions, or vice versa, depending on whether the radiation-imageable material is a positive resist or a negative resist. Regardless, the development transfers a pattern into the radiation-imageable material that is based upon the radiation pattern formed within the radiation-imageable material by the reticle.

Interference effects create several difficulties in attempting to form a desired pattern within a radiation-imageable material. Specifically, a pattern formed in a radiation-imageable material by radiation passing through a patterned mask will typically not be identical to the pattern present in the mask. The difference in the patterns is due to the openings in the mask being similar in size to the wavelength of radiation that is to be patterned by the mask. FIG. 3 illustrates an exemplary problem that can occur during fabrication of a radiation-patterning tool substrate. Specifically, FIG. 3 shows a substrate 110, and a desired pattern 112 that is to be formed in the substrate. The pattern 112 is a four-way intersection. The desired pattern is shown with dashed lines 114. Desired pattern 112 has square corners 116 (i.e., corners which are 90°) where segments join in the four-way intersection. Unfortunately, if the mask utilized to generate the image 112 is identical to the desired pattern of image 112, an image 118 having rounded corners 120 will result after the pattern is written into a radiation-imageable material and transferred into the substrate.

If the problematic reticle of FIG. 3 is subsequently utilized to transfer a pattern onto a radiation-imageable material associated with a semiconductor substrate, the problem of corner rounding can occur again so that the pattern transferred into the radiation-imageable material is even further removed from the ultimately-desired pattern. FIG. 4 illustrates an exemplary semiconductor substrate 122 comprising a radiation-imageable material 124 having a pattern 134 formed therein with the problematic reticle of FIG. 3. A desired pattern 126 is shown in dashed line in FIG. 4 for comparison to the pattern 134 that actually results. The desired pattern 126 is a four-way intersection having square corners 128. The actual pattern 134 has severely rounded corners 130, instead of the desired square corners 128.

A procedure which has been developed to address the problems of FIGS. 3 and 4 is described with reference to FIGS. 5 and 6. FIG. 5 is a diagrammatic representation of a mask 140 utilized to form segments of a reticle merging at relatively square corners. The mask comprises an open region 142, and blocked regions 144. The open region has segments 146, 148, 150 and 152 which merge at corners 154, 156, 158 and 160.

The mask is ultimately to be utilized for forming a four-way intersection of merging segments of a reticle, with the merging segments being patterned by the open region 142. Each of the corners 154, 156, 158 and 160 of mask 140 comprises a so-called anti-serif (with the anti-serifs being labeled as 162, 164, 166 and 168). The anti-serifs can compensate for the interference problems discussed above with reference to FIG. 3 so that the segments formed from the reticle join at substantially square corners, rather than at rounded corners.

As discussed previously, a reticle is typically formed by laser writing or e-beam writing so that the pattern of the reticle is directly written onto a radiation-sensitive material on the reticle substrate, with a shape of the energy beam being modified during the writing. The modification of the energy beam shape forms polygonal images during the writing, and can be considered to be masking occurring during the writing. Accordingly, the mask image of 140 may not exist as a single large mask, but rather can be accomplished with a dataset and a beam manipulation devise utilized during the writing of an image onto a reticle with an energy beam (such as, for example, an electron beam or laser beam).

The processing described with reference to FIG. 5 can form square corners on images patterned into a reticle. Similar processing can be utilized to form square corners on images formed in a radiation-imageable material utilizing the reticle. For instance, FIG. 6 shows a mask 170 corresponding to a reticle configured to form a four-way intersection in a radiation-imageable material. The reticle comprises a relatively transparent region 172, and relatively opaque regions 174. The relatively transparent region 172 comprises merging segments 176, 178, 180 and 182. The reticle further comprises anti-serifs 180, 186, 188 and 190 at corners where the segments merge. The anti-serifs can avoid the problem discussed above with reference to FIG. 4 so that a pattern created with the reticle will be a four-way intersection with square corners rather than the rounded corners discussed with reference to FIG. 4

Interference can create rounded corners on other structures besides intersecting segments. For instance, it is frequently desired to form segments having substantially square corners at ends of the segments. However, interference can lead to rounding of the corners. This problem is described with reference to a construction 200 of FIG. 7. The construction can be a radiation-patterning tool, or a semiconductor substrate. In either event, a mask is utilized to form desired images 202 and 204 on a radiation-imageable material 205 associated with an underlying substrate. (It is noted that the term "substrate" is broad enough as utilized herein that the radiation-imageable material can alternatively be considered part of the substrate.) The desired images are shown with dashed lines, and have ends 206 and 208 respectively, having square corners 203, 205, 207 and 209. Unfortunately, interference effects occurring during formation of the images leads to actual images 210 and 212 being formed which have rounded ends 211 and 213, respectively.

FIGS. 8 and 9 illustrate masking patterns which have been developed to avoid the problem discussed above with reference to FIG. 7. FIG. 8 shows a mask 220 having transparent regions 222 and 224, and having an opaque region 226. The transparent regions have serifs 228, 230, 232 and 234 associated therewith. The serifs are provided to avoid the rounding of the corners discussed above with reference to FIG. 7. FIG. 9 shows the mask 220 with hammerheads 236 and 238 utilized instead of the serifs.

The utilization of anti-serifs, hammerheads and serifs to avoid rounded corners creates several complications in the fabrication of masks. Accordingly, it is desired to develop alternative methods for alleviating, and preferably preventing, undesirable formation of rounded corners during patterning processes.

SUMMARY OF THE INVENTION

In one aspect, the invention includes a method of forming a pattern in a substrate. A feature location of the substrate is defined where a square corner is desired to be patterned into the substrate. A mask is generated which is to be utilized in creating a substantially square corner at the feature location. The mask has a linear sub-resolution component extending at least substantially entirely across the feature location. Radiation is provided through the mask to pattern the substantially square corner at the feature location.

In one aspect, the invention encompasses a method of forming a pattern in a substrate. A first feature location is defined where an end of a first segment is desired to be patterned into the substrate, and a second feature location is defined where an end of a second segment is desired to be patterned into the substrate. An expanse of the substrate is defined which extends between the first and second feature locations. A mask is generated which is to be utilized in creating the ends of the first and second segments at the first and second locations. The mask has an opening extending entirely across the first and second feature locations, and has a sub-resolution component within the opening and over a portion of the expanse. The sub-resolution component is a ribbon of the opening extending an entire length of the expanse. Radiation is provided through the mask to pattern the ends of the first and second segments.

In one aspect, the invention encompasses a method of forming a pattern in a substrate. An intersection location is defined in the substrate where an intersection is desired to be patterned into the substrate. The intersection comprises at least one corner that is desired to be patterned into the substrate as a substantially 90° corner. The intersection has a plurality of inlet/outlet segments joining at a polygonal body region. A mask is generated which is to be utilized in creating the intersection at the intersection location. The mask has an opening extending entirely across the intersection location except for one or more sub-resolution components within the opening. The one or more sub-resolution components are linear segments at one or more portions of the mask corresponding to interfaces between inlet/outlet segments and the substantially polygonal body region. Radiation is provided through the mask to pattern the intersection with the at least one substantially 90° corner.

BRIEF DESCRIPTION OF THE DRAWINGS

Preferred embodiments of the invention are described below with reference to the following accompanying drawings.

FIG. 13 is a diagrammatic representation of a pattern that can be formed with the mask of FIG. 12.

FIG. 14 is a diagrammatic representation of another mask that can be utilized in accordance with an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The exposure tools utilized to form reticles, for example, laser writing tools and electron-beam writing tools, frequently have difficulty resolving features below a particular threshold. In some aspects, the present invention utilizes the inability of the exposure tool to resolve features below a certain threshold to advantage to form sharp corners, and to avoid line end shortening. The present invention can utilize induced gaps between normally connected geometries to add or remove exposure energy at corners, and thus result in sharper images with less corner rounding. The invention can similarly utilize induced gaps to avoid line end "pullback".

In some aspects, the invention can be considered to utilize gaps between normally attached geometries instead of utilizing "bumps" (serifs/hammerheads) at outside corners, or taking "bites" (anti-serifs) at inside corners. The gaps provided with aspects of the present invention can add or remove exposure energy (depending on the tone of the feature (clear/dark) and the desired effect sought). An advantage of the present invention over existing proximity corrections is that aspects of the present invention can result in resolution gains of aggressive optical proximity correction while eliminating or greatly reducing the figure count in data utilized to create a mask. This in turn can reduce the resources and time utilized to generate the data. In other words, the generation of a mask can be simplified in aspects of the present invention relative to the prior art since the mask can have a simpler geometry utilized to correct for rounding of corners. Aspects of the present invention can be utilized in generating masks utilized for forming reticles, and also can be incorporated into the reticles themselves and thereby utilized in reticle masks utilized for patterning semiconductor substrates.

Figure 10:
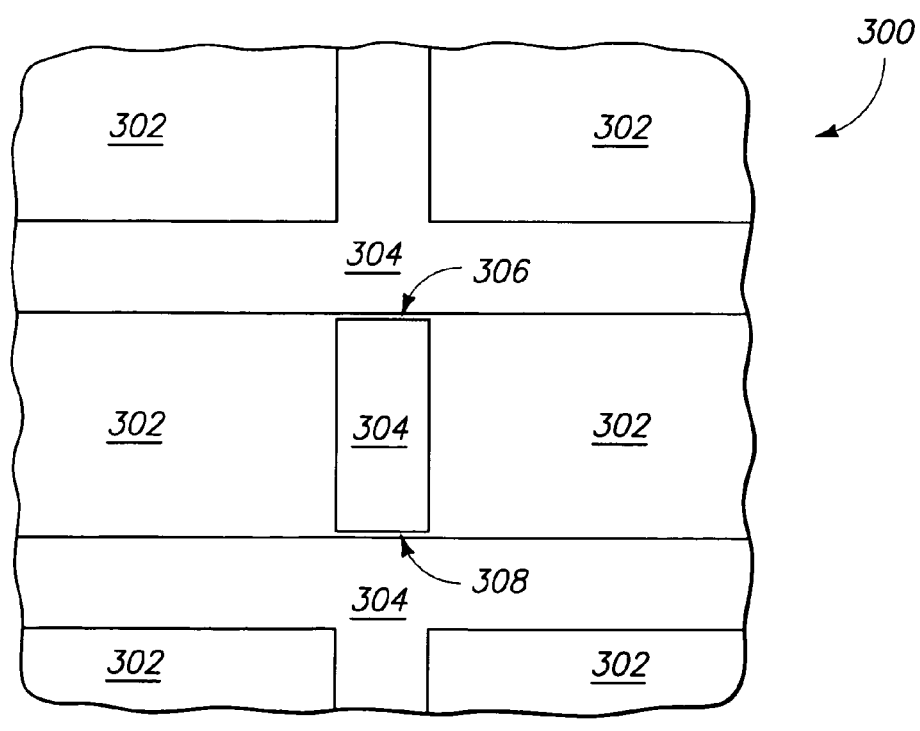
FIG. 10 is a diagrammatic representation of a mask that can be utilized in accordance with an aspect of the present invention.
Figure 11:
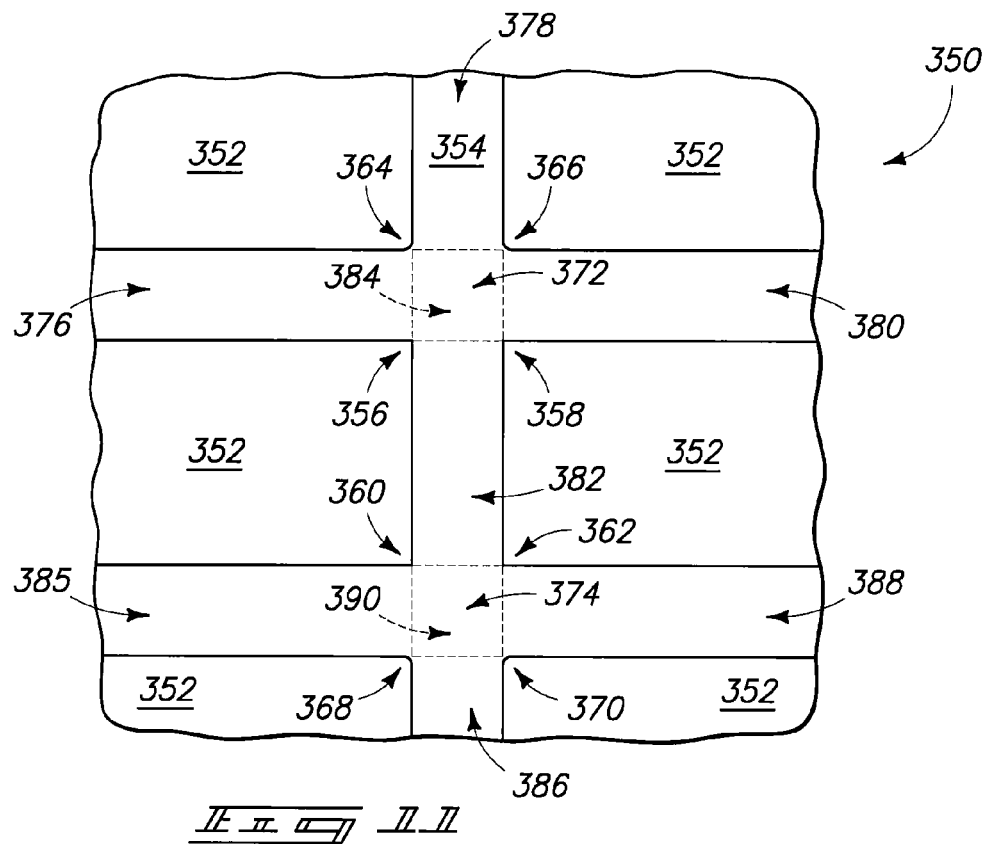
FIG. 11 is a diagrammatic representation of a pattern that can be formed with the mask of FIG. 10.

Particular aspects of the present invention are described with reference to FIGS. 10-15. Referring initially to FIGS. 10 and 11, a mask image 300 is diagrammatically illustrated in FIG. 10 and a pattern formed with the mask image is diagrammatically illustrated with reference to a construction 350 in FIG. 11. The construction 350 comprises a substrate 352 supporting a pattern 354. The substrate includes a radiation-imageable material, and the pattern 354 is a pattern of radiation intensity formed within the radiation-imageable material. In some aspects, the substrate can include a semiconductor structure under the radiation-imageable material, and in some aspects the substrate can include a radiation-patterning tool structure (such as, for example, a reticle substrate) under the radiation-imageable material. The pattern 354 can be a region written onto the radiation-sensitive material with a writing tool (such as, for example, a laser writing tool or an e-beam writing tool), or can be a region patterned utilizing radiation passed through a patterned reticle.

Figure 1:
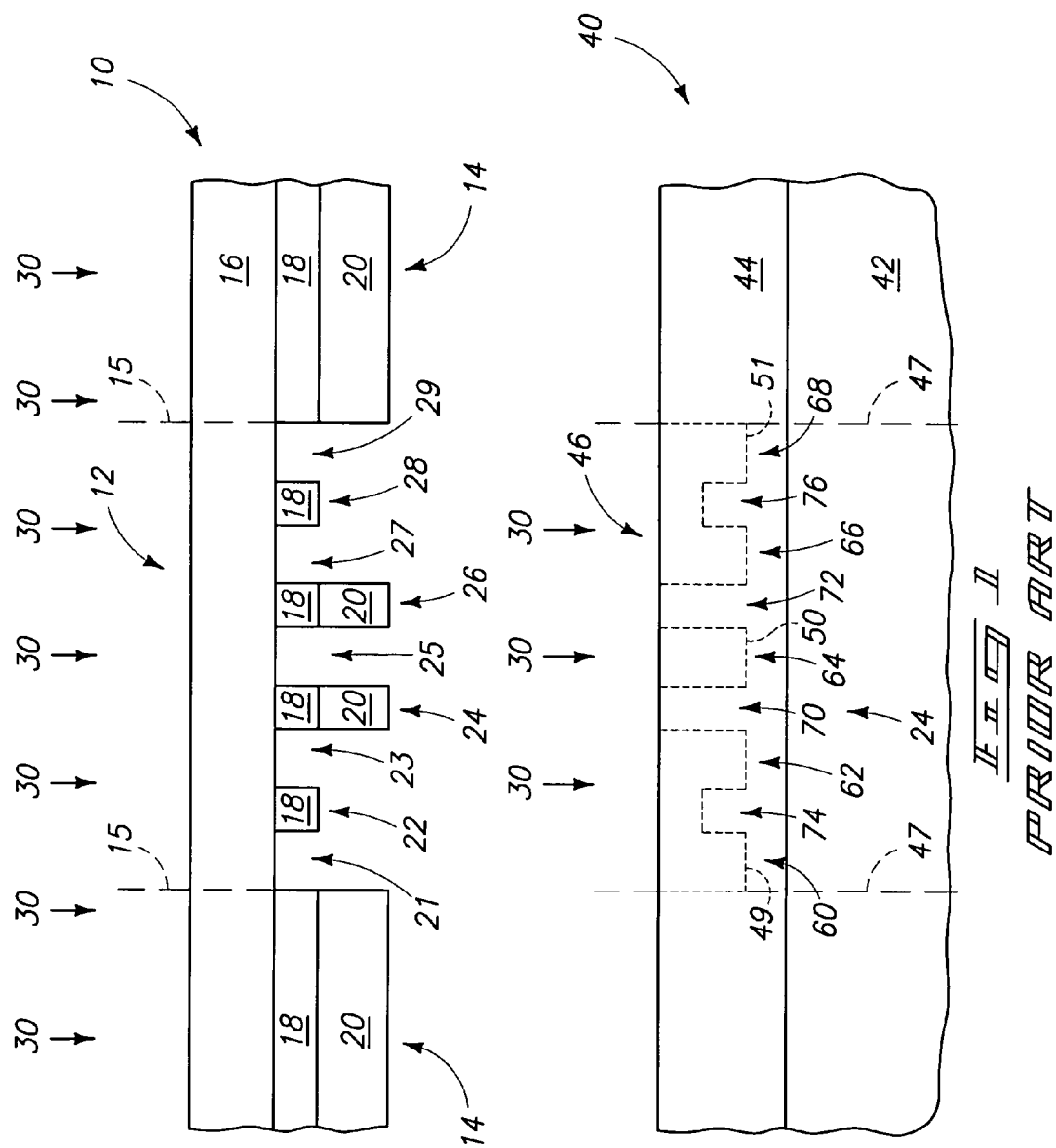
FIG. 1 is a diagrammatic, cross-sectional view of a fragment of a reticle and a fragment of a semiconductor substrate shown at a prior art processing stage in which the reticle is utilized to pattern radiation directed toward the semiconductor substrate.
Figure 2:
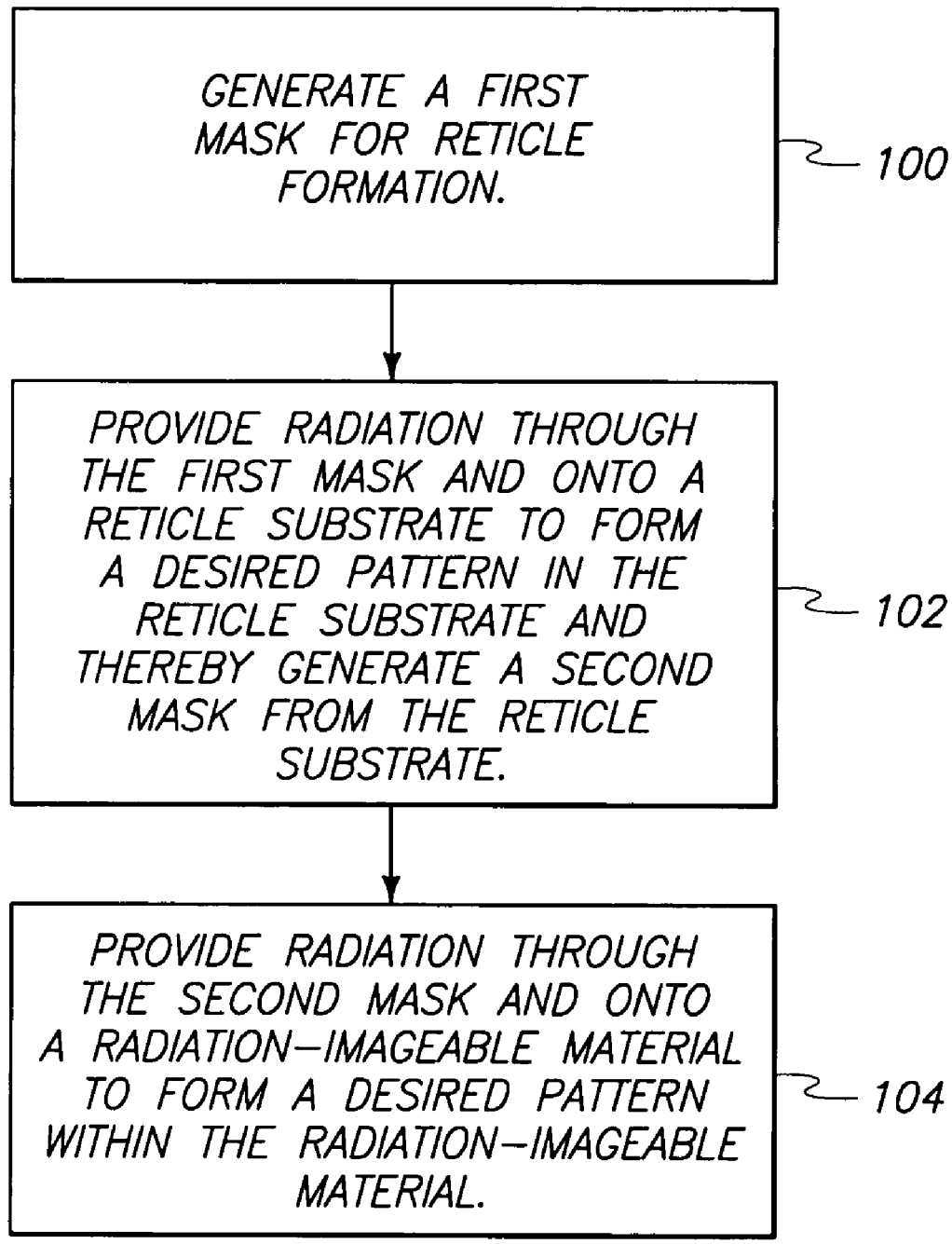
FIG. 2 is a flow chart description of a prior art method of forming and utilizing a reticle.
Figure 3:
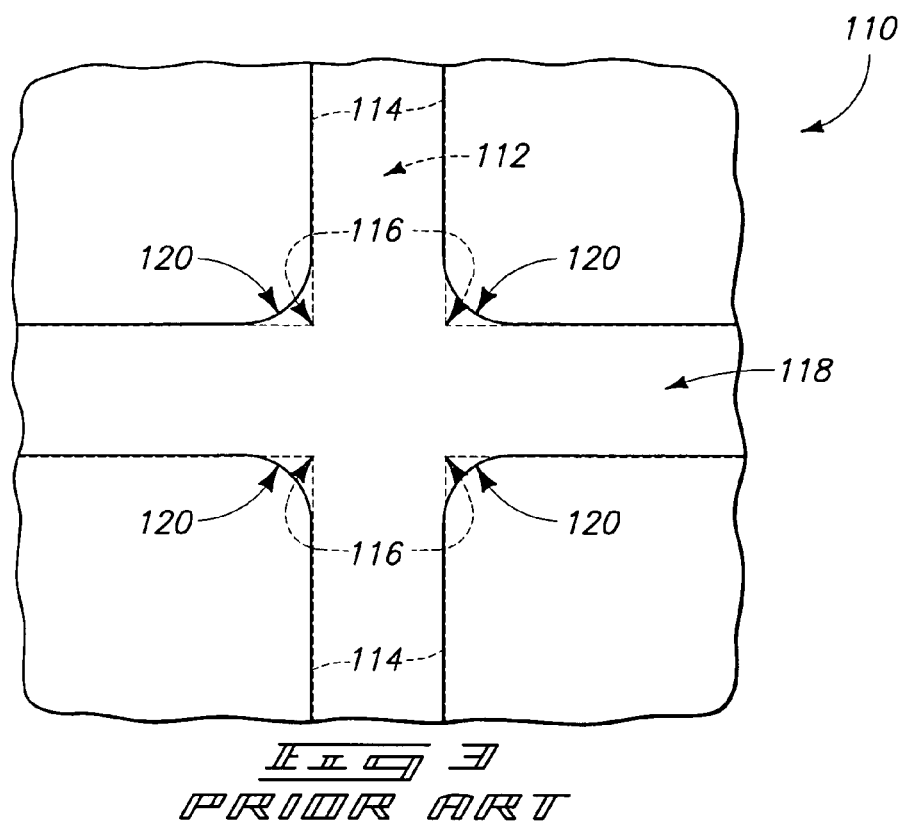
FIG. 3 is a diagrammatic view of a prior art reticle substrate contrasting a desired pattern with a pattern actually formed in the reticle substrate.
Figure 4:
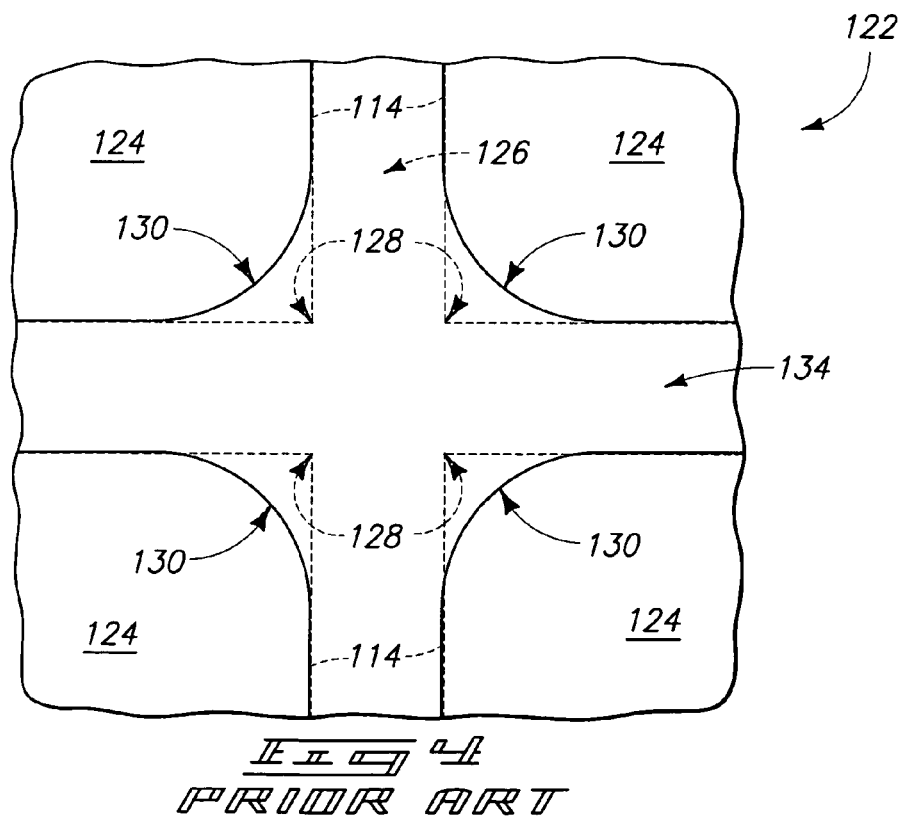
FIG. 4 is a diagrammatic view of a prior art semiconductor substrate contrasting a desired pattern with a pattern actually formed in the semiconductor substrate.
Figure 5:
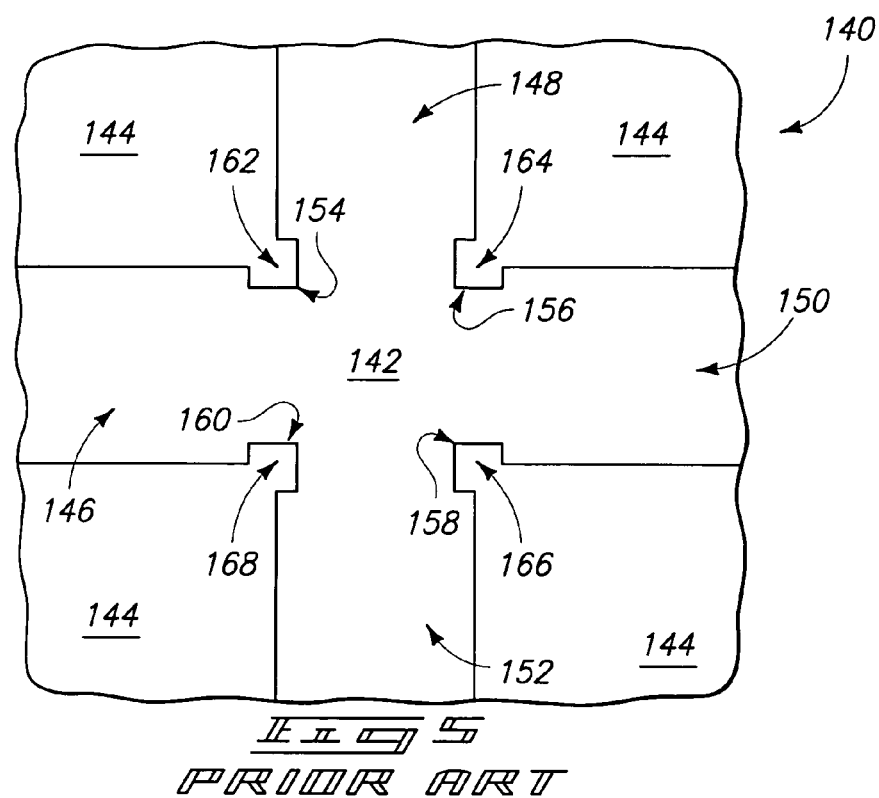
FIG. 5 is a diagrammatic representation of a mask that can be utilized for forming a reticle in accordance with a prior art process.
Figure 6:
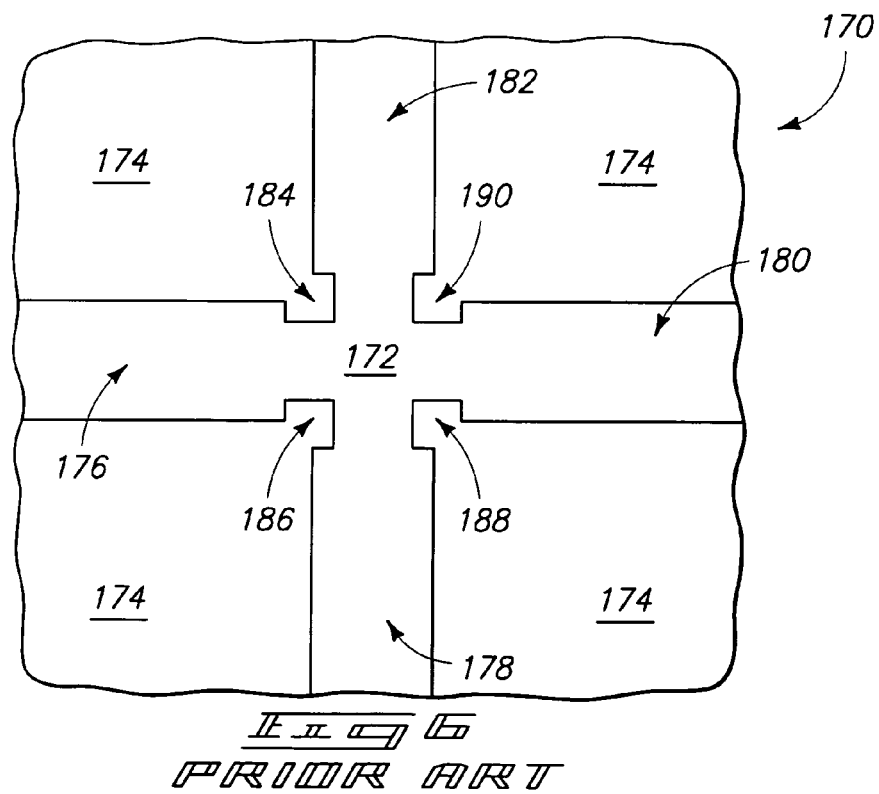
FIG. 6 is a diagrammatic representation of a reticle configuration that can be utilized for patterning a semiconductor substrate in accordance with a prior art process.
Figure 7:
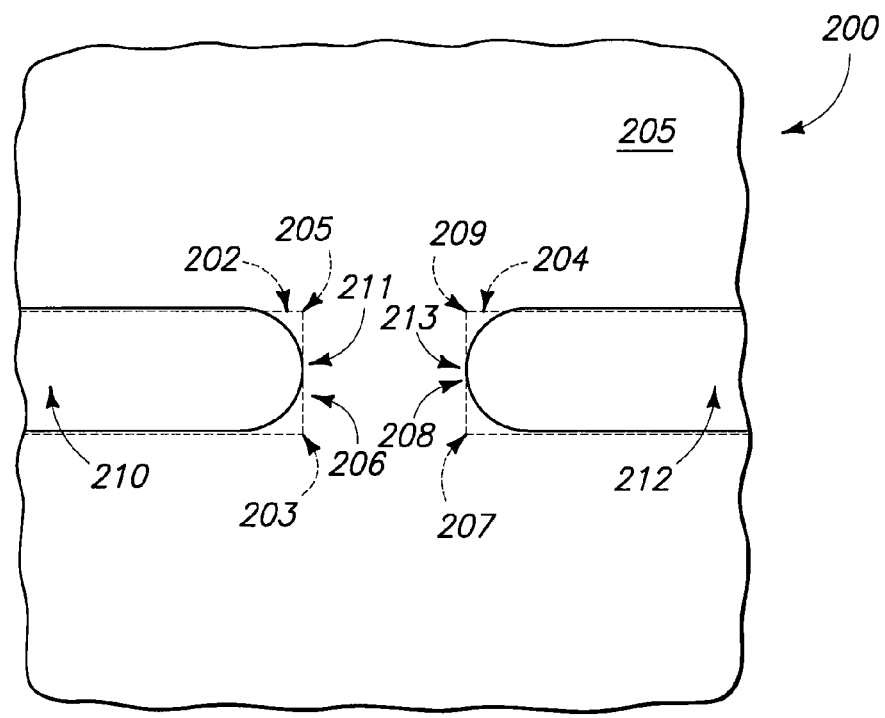
FIG. 7 is a diagrammatic view of a patterned material contrasting a desired image with an image actually formed in a prior art process.
Figure 8:
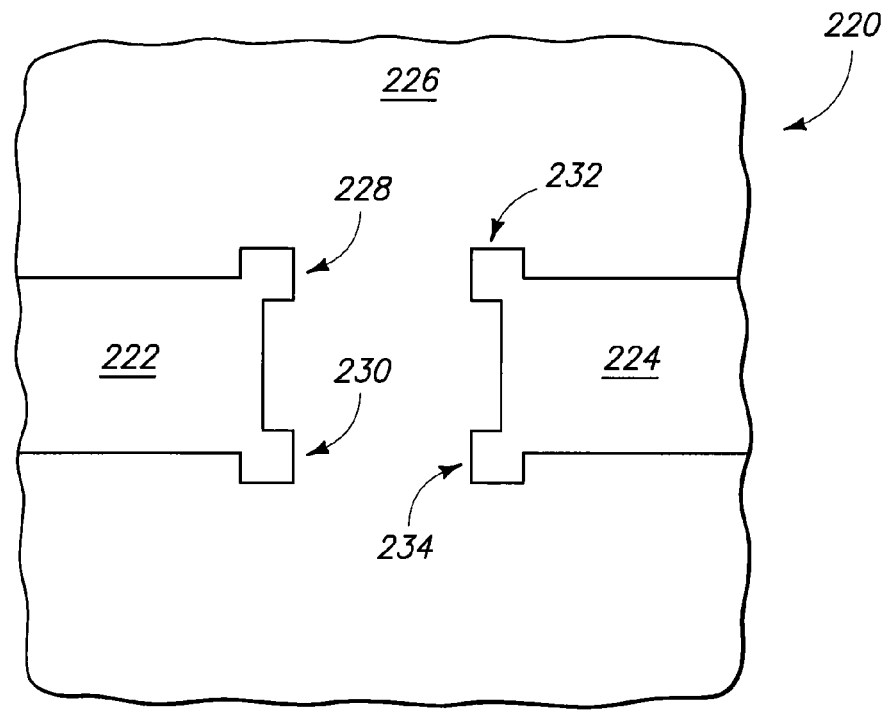
FIG. 8 is a diagrammatic representation of a mask that can be utilized in accordance with an aspect of the prior art.
Figure 9:
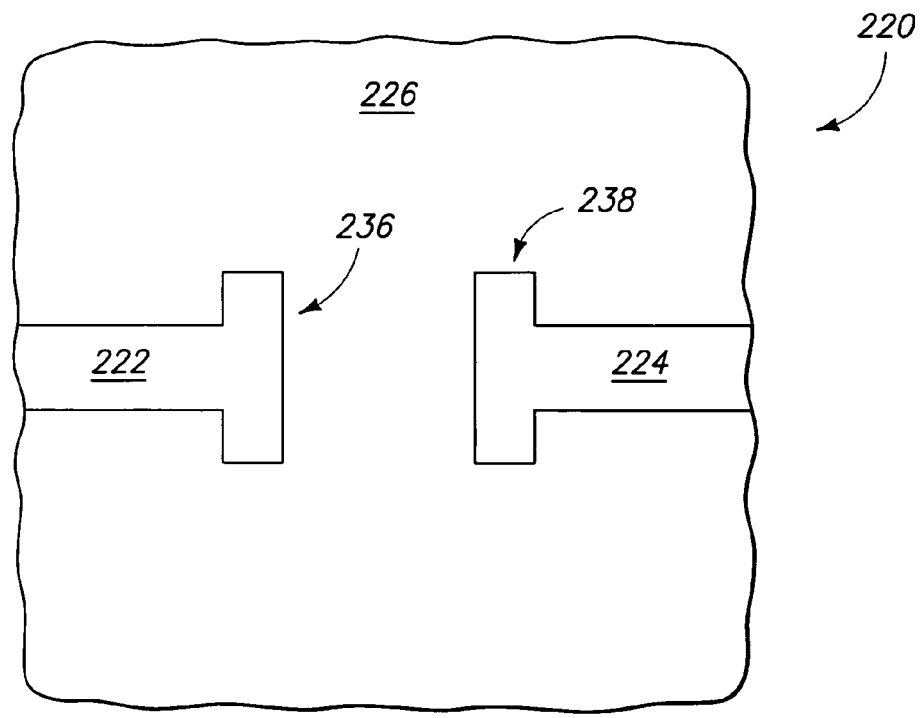
FIG. 9 is a diagrammatic representation of another mask that can be utilized in accordance with another aspect of the prior art.

If the pattern 354 is formed in a radiation-imageable material associated with a reticle structure, the pattern can ultimately be transferred into the reticle structure with an appropriate etch. For instance, the reticle structure underlying the radiation-imageable material can comprise a relatively opaque material in combination with a relatively transparent material (such as, for example, a chromium-containing material in combination with a quartz base), and the patterned region 354 can correspond to a region ultimately etched through the relatively opaque material to the underlying relatively transparent material. Alternatively, the reticle structure could include a material of intermediate transparency (analogous to the material 18 of FIG. 1), and at least some of the patterned region 354 could correspond to a region ultimately etched to, but not entirely through, the material of intermediate transparency.

Patterned region 354 comprises feature locations 356, 358, 360 and 362 where relatively square corners are desired to be patterned into the substrate. The shown patterned region also comprises feature locations 364, 366, 368 and 370 where it is of less concern if the corners are square.

In some aspects, the patterned region 354 can be considered to comprise a pair of four-way intersections 372 and 374. The four-way intersection 372 has inlet/outlet segments 376, 378, 380 and 382 joining at a polygonal body region 384. The shown polygonal body region is substantially rectangular in shape (specifically is a square). Similarly, the four-way intersection 374 comprises inlet/outlet segments 382, 385, 386 and 388 joining at a substantially polygonal body region 390.

The intersections 372 and 374 can be considered to be intersection regions of the substrate in which it is desired to pattern the intersections into the substrate. The shown intersection regions have two substantially 90° corners, and two corners which are rounded. It is to be understood, however, that invention encompasses other aspects in which the intersection locations are desired to have all of the corners be substantially 90°, as well as variations in which only one of the corners is desired to be substantially 90°, or in which some plurality that is less than all of the corners is desired to be substantially 90°. The term "substantially 90°" is utilized to indicate that the corners are within desired tolerances of 90°, which in some aspects can be 90° to within limits of detection.

The inlet/outlet segments of the shown four-way intersections are substantially orthogonal to one another, and accordingly the desired square corners 356, 358, 360 and 362 can be considered to be formed at junctions between pairs of substantially orthogonal segments. For instance, the corner 358 is formed at a junction between the segments 380 and 382 that are substantially orthogonal to one another.

The pattern 354 can be an intensity pattern formed within a radiation-imageable material, and the material can be subsequently developed to physically form the shown substantially square corners within the radiation-imageable material. The pattern can be then be transferred to an underlying structure (for instance a semiconductor substrate or a radiation-patterning tool substrate) with an appropriate etch utilizing the patterned radiation-imageable material as a mask.

The mask image 300 of FIG. 10 corresponds to a mask generated to create the substantially square corners 356, 358, 360 and 362 at the shown locations of the FIG. 11 pattern 354. The mask image 300 comprises a relatively opaque region 302, and relatively transparent regions 304. The relatively transparent regions 304 can be considered to be openings extending within the relatively opaque regions, and can be considered to correspond to window regions. The mask image 300 can be an actual mask in applications in which the image corresponds to a reticle utilized to pattern a radiation-imageable material, or can represent a compilation of multiple writing steps in, for example, applications in which the image 300 represents a pattern provided to drive a writing tool (such as, for example, a laser writing tool for an e-beam writing tool) during utilization of the writing tool to write a pattern into a radiation-imageable material.

The opening 304 extends substantially entirely across the patterned region 354 of FIG. 11, but does not extend entirely across such patterned region. Instead, the masking image comprises sub-resolution components 306 and 308 over some portions of the patterned region. Specifically, the sub-resolution components are over portions of the patterned region where square corners 356, 358, 360 and 362 are to be formed.

The sub-resolution components are referred to as being "sub-resolution" to indicate that the components are too small to lead to distinct features being formed by radiation patterned with the masking image 300. Instead, the sub-resolution components merely modify the radiation. Such modification is sufficient, however, to reduce rounding that would otherwise occur at corners in the absence of the sub-resolution components, and to thus form the desired substantially square corners at locations 356, 358, 360 and 362 of the construction 350. In contrast, corners 364, 366, 368 and 370 are formed in locations where there were no sub-resolution components provided, and accordingly such corners are rounded. In other aspects of the invention, sub-resolution components can be provided on opposing sides of a four-way intersection so that all of the corners of the intersection are substantially square corners. The sub-resolution components can specifically be provided at interfaces where inlet/outlet segments join a polygonal body region of an intersection to form substantially square corners at such locations of the intersection.

The sub-resolution components 306 and 308 are linear components extending across regions where the substantially square corners are to be patterned. Components 306 and 308 are referred to as linear components to emphasize that the components do not have bulbous polygonal regions characteristic of serifs, anti-serifs and hammerheads. Rather the components 306 and 308 are simple lines of relatively opaque material forming gaps between window regions 304. In the shown aspect of the invention, the sub-resolution components are linear lengths, or ribbons, of relatively opaque material extending as interfaces between adjacent openings 304. Each of the components 306 and 308 extends across an entire width of an intersecting segment, and thus extends across two of the substantially square corners. For instance, the component 306 extends across both of the corners 356 and 358 of the construction 350; and accordingly is utilized to simultaneously pattern both of such corners. The relatively opaque material of the components 306 and 308 can be entirely opaque in some applications, or can be material which attenuates radiation but is not entirely opaque to the radiation (for instance, the material 18 of FIG. 1) in other applications.

Although the sub-resolution components are described above as being relatively opaque material formed between adjacent openings, it is to be understood that the sub-resolution components could also be formed as relatively transparent openings between segments of relatively opaque material. For instance, the relatively transparencies of regions 302 and 304 can be reversed in some applications so that region 304 is relatively opaque and region 302 is relatively transparent.

In some aspects, a location where an intersection is desired to be patterned can be considered to have a first section corresponding to an inlet/outlet segment and a second section corresponding to a polygonal body region. For instance, intersection location 372 can be considered to comprise a first section corresponding to inlet/outlet segment 382 and a second section corresponding to polygonal body region 384. The generated mask 300 can then be considered to comprise a first mask section over the first section of the intersection location, a second mask section over the second section of the intersection location, and the sub-resolution component 306 separating the first mask section from the second mask section. The first and second mask sections can be considered to have a first transparency, and the sub-resolution component can be considered to have a second transparency different from the first transparency. In some embodiments the second transparency can be greater than the first transparency, and in other embodiments the second transparency can be less than the first transparency.

Figure 12:
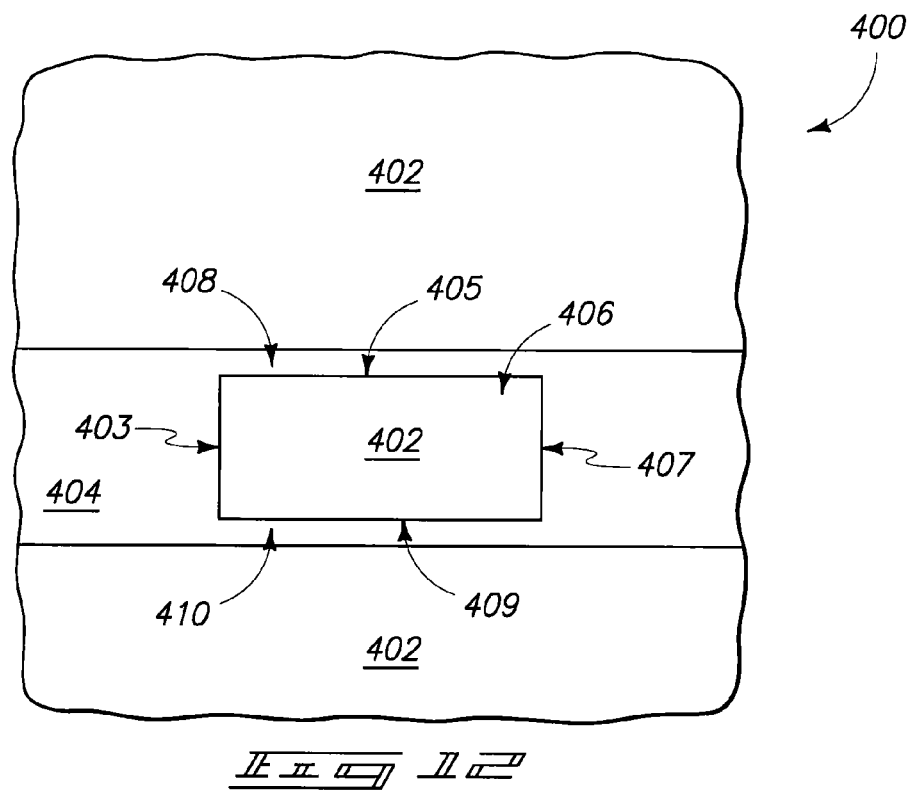
FIG. 12 is a diagrammatic representation of another mask that can be utilized in accordance with an aspect of the present invention.

Another aspect of the invention is described with reference to FIGS. 12 and 13. FIG. 12 illustrates a masking image 400, and FIG. 13 illustrates a construction 450 comprising a pattern which can be generated with the masking image 400. More specifically, FIG. 13 shows a substrate 452 having a pattern 454 formed therein. The pattern corresponds to a pair of line segments 456 and 458 having ends 460 and 462. Each of the ends has a pair of substantially square corners, with the corners being labeled 461, 463, 465 and 467.

The patterned region 454 can correspond to a radiation intensity pattern formed within a radiation-imageable material. In subsequent processing, the radiation-imageable material can be developed to physically form the shown pattern within the material. The pattern can then be transferred into a structure (for example, a semiconductor substrate or radiation-patterning tool substrate) underlying the radiation-imageable material. The patterned region 454 can be formed in the radiation-imageable material by passing radiation through a patterned reticle, or with a writing tool, such as, for example, a laser writing tool or an e-beam writing tool.

The ends 460 and 462 can be considered to be first and second feature locations within a substrate where ends of first and second segments, respectively, are desired. The substrate comprises an expanse 470 extending between the first and second feature locations.

The masking image 400 comprises relatively opaque regions 402, and a relatively transparent region 404. The masking image 400 can be considered to be a mask generated to be utilized in creating the ends of the first and second segments 456 and 458 of construction 450. Masking image 400 can correspond to an actual mask, such as, for example, a reticle utilized for patterning a radiation-imageable material, or can correspond to a representation of a data set provided to a writing tool during utilization of the tool to write an image. In either event, image 400 can be referred to as a mask.

The opening 404 of the masking image 400 extends entirely across the first and second feature locations corresponding to ends 460 and 462 of construction 450. A portion of the relatively opaque material 402 forms a block 406 within the opening. Such block has four primary peripheral edges 403, 405, 407 and 409. Sub-resolution components of opening 404 are along edges 405 and 409, with such sub-resolution components of the opening being in the locations labeled 408 and 410. The sub-resolution components 408 and 410 are linear expanses, or ribbons, of opening 404 extending along primary sides 405 and 409, respectively, of block 402.

Radiation patterned by masking image 400 forms the desired pattern in construction 450 of the pair of line segments 456 and 458 having square ends 460 and 462. In other words, the masking image forms the desired substantially square corners 461, 463, 465 and 467.

The described embodiment of FIGS. 12 and 13 illustrates an aspect in which a sub-resolution component is relatively transparent to the radiation that is utilized during formation of a desired pattern. It is to be understood that the sub-resolution component can also be relatively opaque to the radiation if the relative transparencies of regions 402 and 404 are reversed so that regions 402 are relatively transparent and region 404 is relatively opaque.

In some aspects, region 402 can be considered to be a bridge extending entirely across the feature locations corresponding to the ends 460 and 462 of the line segments, and the sub-resolution components (408 and 410) can be considered to be a linear segments along the sides of the bridge and also extending entirely across the feature locations corresponding to the ends 460 and 462 of the line segments. The region 402 and the sub-resolution components have transparencies which differ relative to one another, with the region 402 being more transparent than the sub-resolution components in some embodiments, and less transparent than the sub-resolution components in other embodiments.

Figure 15:
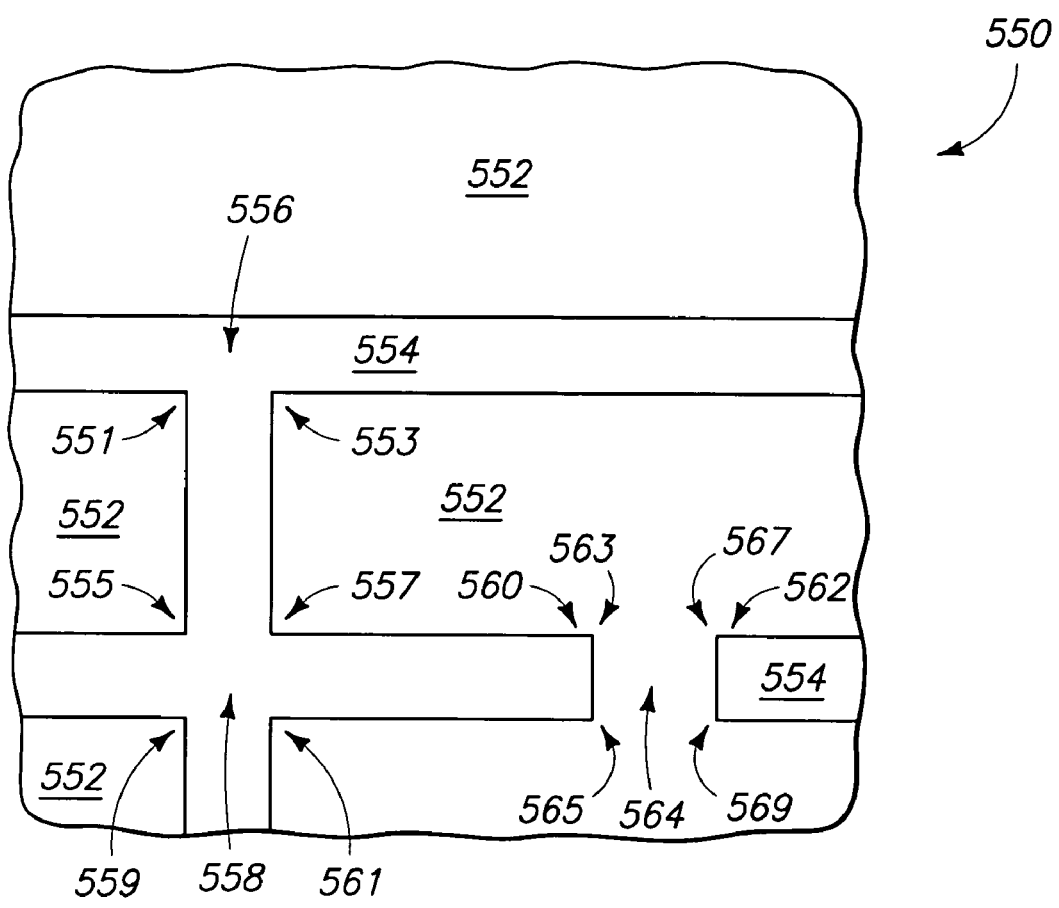
FIG. 15 is a diagrammatic representation of a pattern that can be formed with the mask of FIG. 14.

The embodiment of FIGS. 10 and 11 can be utilized in combination with that of FIGS. 12 and 13, as described with reference to FIGS. 14 and 15. FIG. 14 illustrates a masking image 500, and FIG. 15 illustrates a construction 550 containing a pattern formed with the masking image 500. The construction 550 includes a substrate 552 having a pattern 554 formed therein. The pattern 554 includes a pair of intersections 556 and 558, and also includes line segments having ends 560 and 562 spaced from one another by an expanse 564 of the substrate.

The pattern 554 includes numerous square corners, which are labeled 551, 553, 555, 557, 559, 561, 563, 565, 567 and 569.

The masking image 500 comprises two types of regions (502 and 504), of which one is relatively opaque region and the other is relatively transparent. The masking image also comprises sub-resolution block components 506, 508 and 510 that have transparency comparable to that of regions 502; and sub-resolution components 512 and 514 that have transparency comparable to that of region 504. The masking image 500 can be utilized to form the pattern 554 having the numerous substantially square corners at intersections of segments, as well as at the ends of segments.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a pattern in a substrate, comprising:
defining an intersection location of the substrate where an intersection is desired to be patterned into the substrate; the intersection comprising at least one corner that is desired to be patterned into the substrate as a substantially 90 degree corner; the intersection having a plurality of inlet/outlet segments joining at a polygonal body region;
generating a mask to utilize in creating the intersection at the intersection location, the mask having a first section extending across an inlet/outlet segment, a second section extending across the polygonal body region, and a linear sub-resolution component separating the first section from the second section; the first and second sections having a first transparency, and the sub-resolution component having a second transparency which is different from the first transparency; and
providing radiation through the mask to pattern the intersection with the at least one substantially 90 degree corner.

2. The method of claim 1 wherein the first transparency is less than the second transparency.

3. The method of claim 1 wherein the first transparency is greater than the second transparency.

4. A method of forming a pattern in a substrate, comprising:
defining an intersection location of the substrate where an intersection is desired to be patterned into the substrate; the intersection comprising at least one corner that is desired to be patterned into the substrate as a substantially 90 degree corner; the intersection comprising a plurality of inlet/outlet segments joining at a polygonal body region;
generating a mask to utilize in creating the intersection at the intersection location, the mask having an opening entirely across the intersection location except for one or more sub-resolution components within the opening; the one or more sub-resolution components being linear segments at one or more portions of the mask corresponding to interfaces between inlet/outlet segments and the substantially polygonal body region; and
providing radiation through the mask to pattern the intersection with the at least one substantially 90 degree corner.

5. The method of claim 4 wherein the mask comprises only one of the sub-resolution components.

6. The method of claim 4 wherein the substrate is a radiation-patterning tool substrate having a radiation-imageable surface, and wherein the intersection is patterned within the radiation-imageable material, the method further comprising developing the radiation-imageable material to physically form the intersection within the radiation-imageable material.

7. The method of claim 4 wherein the substrate is a semiconductor substrate having a radiation-imageable surface, and wherein the intersection is patterned within the radiation-imageable material, the method further comprising developing the radiation-imageable material to physically form the intersection within the radiation-imageable material.

8. The method of claim 4 wherein the intersection is a four-way intersection comprising four of the inlet/outlet segments, and wherein the substantially polygonal body region is a substantially rectangular body region.

9. The method of claim 8 wherein the mask comprises only one of the sub-resolution components.

10. The method of claim 8 wherein the mask comprises two of the sub-resolution components, with said two of the sub-resolution components being on opposing sides of the substantially rectangular body region relative to one another.

11. The method of claim 8 wherein the four-way intersection is patterned to comprise four of the substantially 90 degree corners.

12. The method of claim 8 wherein the substrate is a semiconductor substrate having a radiation-imageable surface, and wherein the four-way intersection is patterned within the radiation-imageable material, the method further comprising developing the radiation-imageable material to physically form the four-way intersection within the radiation-imageable material.

13. The method of claim 8 wherein the substantially rectangular body region is a substantially square body region.

* * * * *